United States Patent [19]
Arami et al.

[11] Patent Number: 6,035,804
[45] Date of Patent: Mar. 14, 2000

[54] PROCESS CHAMBER APPARATUS

[75] Inventors: Junichi Arami, Tokyo; Shosuke Endo, Nirasaki, both of Japan

[73] Assignee: Tokyo Electron Limited, Tokyo, Japan

[21] Appl. No.: 09/186,328

[22] Filed: Nov. 5, 1998

[30] Foreign Application Priority Data

Nov. 7, 1997 [JP] Japan .................................. 9-304795

[51] Int. Cl.⁷ .................................................. C23C 16/00
[52] U.S. Cl. ...................... 118/723 E; 118/715; 118/728
[58] Field of Search .................................... 118/715, 728, 118/723 E; 156/345

[56] References Cited

U.S. PATENT DOCUMENTS 5,480,052   1/1996   Furr et al. ................................. 216/71

*Primary Examiner*—Richard Bueker
*Attorney, Agent, or Firm*—Pillsbury Madison & Sutro LLP

[57] ABSTRACT

A process chamber apparatus includes a process chamber for processing a target such as a semiconductor wafer contained therein. The chamber includes an upper process chamber section having an annular contact surface at a lower end thereof and a lower process chamber section having an annular contact surface at an upper end thereof. A support mechanism supports the process chamber such that the lower section is movable against the upper section in a lateral direction between a process position where both sections are combined with each other and a separation position where both of the sections are separated apart from each other in a lateral direction. The contact surfaces of the upper and lower process chamber sections are inclined with respect to a plane including a movement direction of the lower process chamber section and are brought into contact with each other throughout entire circumferences of the contact surfaces at the process position.

12 Claims, 8 Drawing Sheets

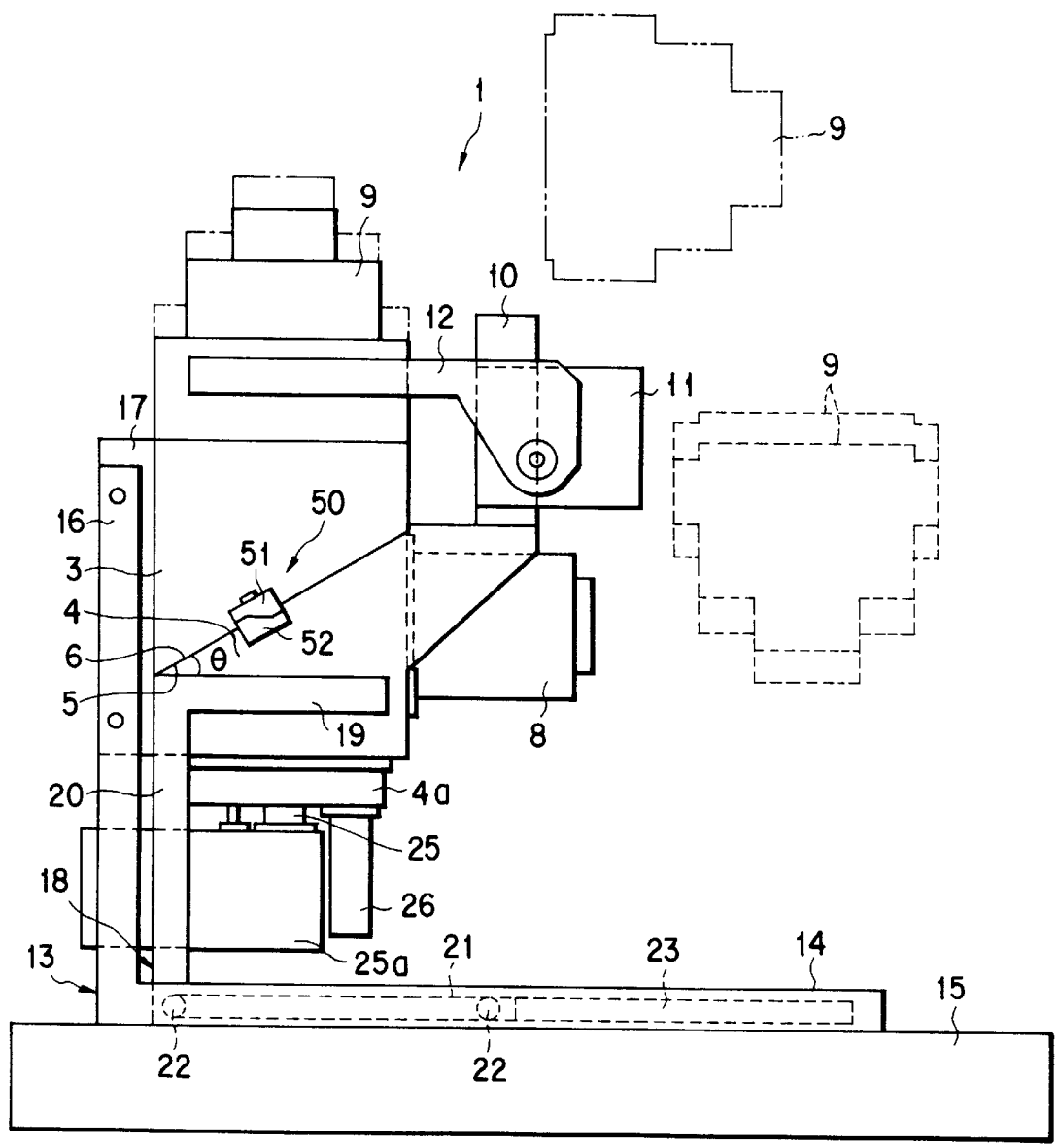
F I G. 2

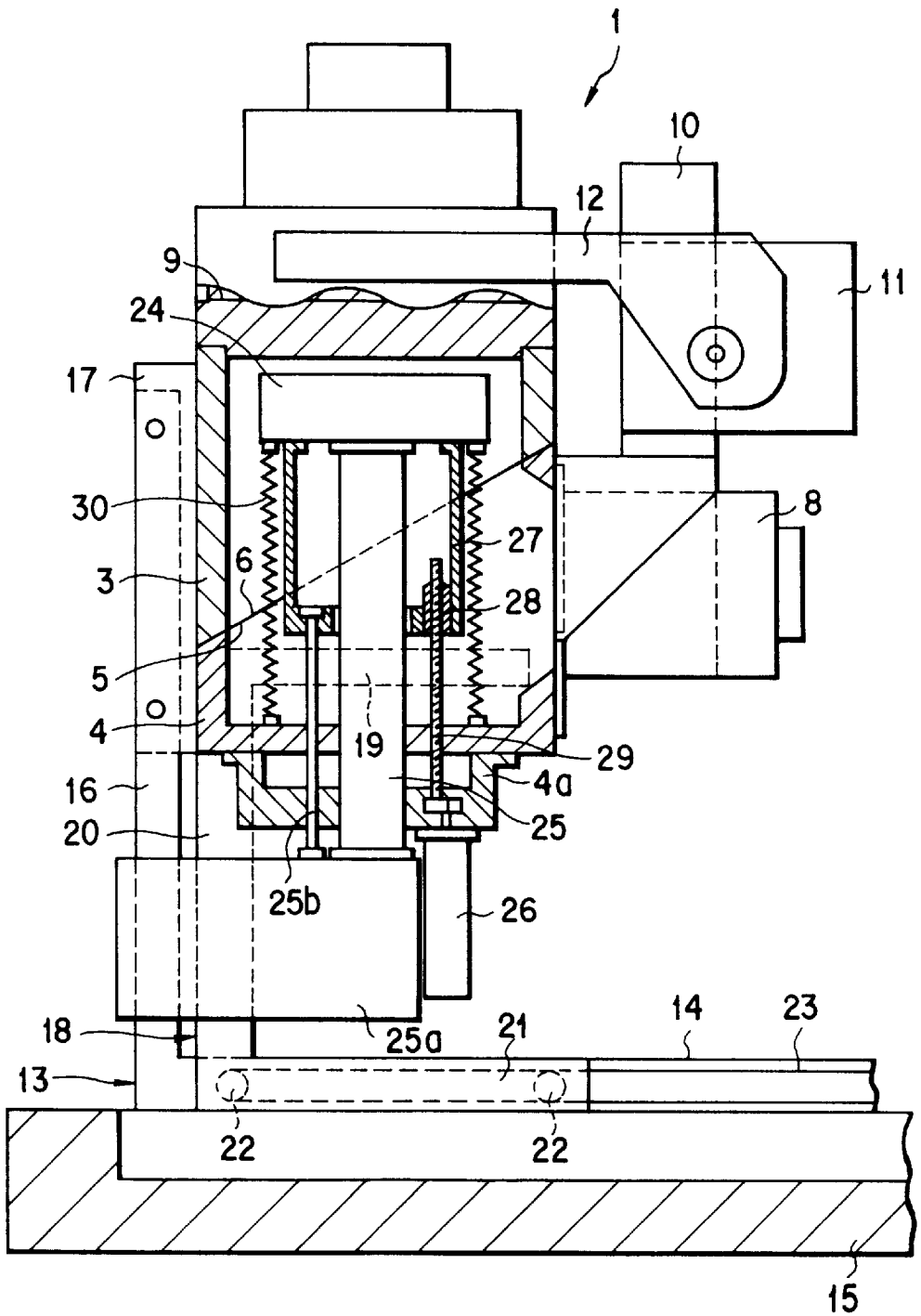
F I G. 3

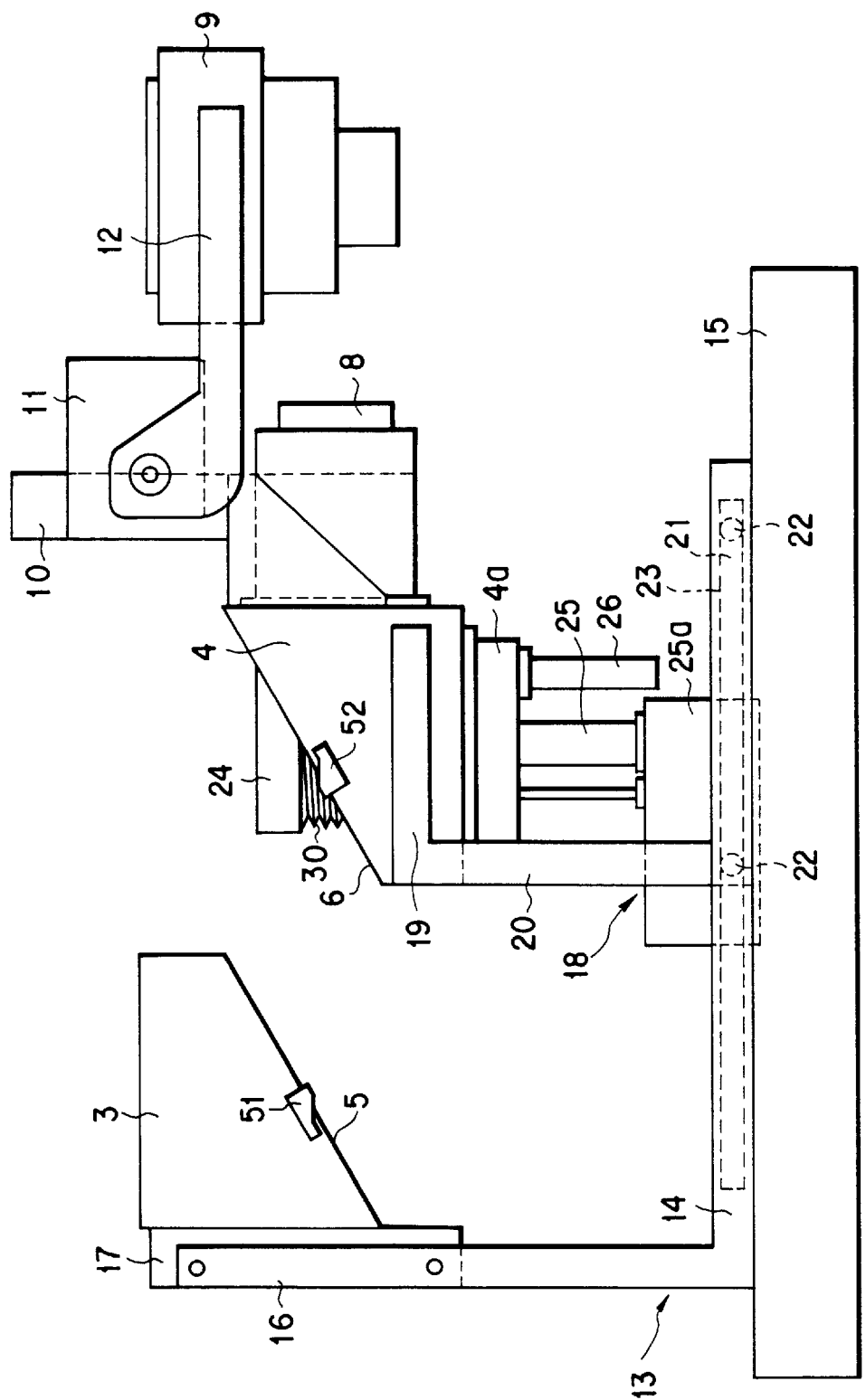
F I G. 4

PROCESS CHAMBER APPARATUS

BACKGROUND OF THE INVENTION

The present invention relates to a process chamber apparatus for processing one or more objects housed therein.

A process chamber of a process apparatus such as a CVD apparatus and an etching apparatus includes a member such as a lower electrode on which an object to be processed, such as a semiconductor wafer and a glass substrate, is placed, and the maintenance of the inside of the process chamber, e.g., the inspection and cleaning of the above member and the inner wall of the process chamber has been performed on a day-to-day basis. In a prior art process apparatus, an operator performs maintenance of the inside of a process chamber by hand through an opening formed in the top end of the chamber or by inserting a jig into the chamber from the opening. However, not only such an operation is troublesome, and takes a lot of time and decreases the productivity of the process apparatus, but also the maintenance is not necessarily performed satisfactorily.

BRIEF SUMMARY OF THE INVENTION

An object of the present invention is to provide a process chamber apparatus which facilitates the maintenance of the inside of a process chamber.

A process chamber apparatus according to the present invention comprises a process chamber for processing a process target contained therein. The chamber includes an upper process chamber section having an annular contact surface at a lower end of the upper process chamber section, and a lower process chamber section having an annular contact surface at an upper end. A support mechanism supports the process chamber such that both of the upper and lower process chamber sections are relatively movable in a lateral direction between a process position where both of the upper and lower process chamber sections are combined with each other and a separation position where both of the process chamber sections are separated apart from each other in a lateral direction. Preferably, the contact surfaces of the upper and lower process chamber sections may be inclined with respect to a plane including a movement direction of the process chamber sections and may be brought into contact with each other throughout entire circumferences of the contact surfaces at the process position.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a right-hand side view of the CVD apparatus illustrated in FIG. 1;

FIG. 3 is a longitudinal sectional view depicting a process chamber in use and a lower part of an upper electrode;

FIG. 4 is a side view of a lower process chamber section of the apparatus shown in FIGS. 1 to 3, which is separated from an upper process chamber section and moved to a maintenance position;

DETAILED DESCRIPTION OF THE INVENTION

Figure 1:
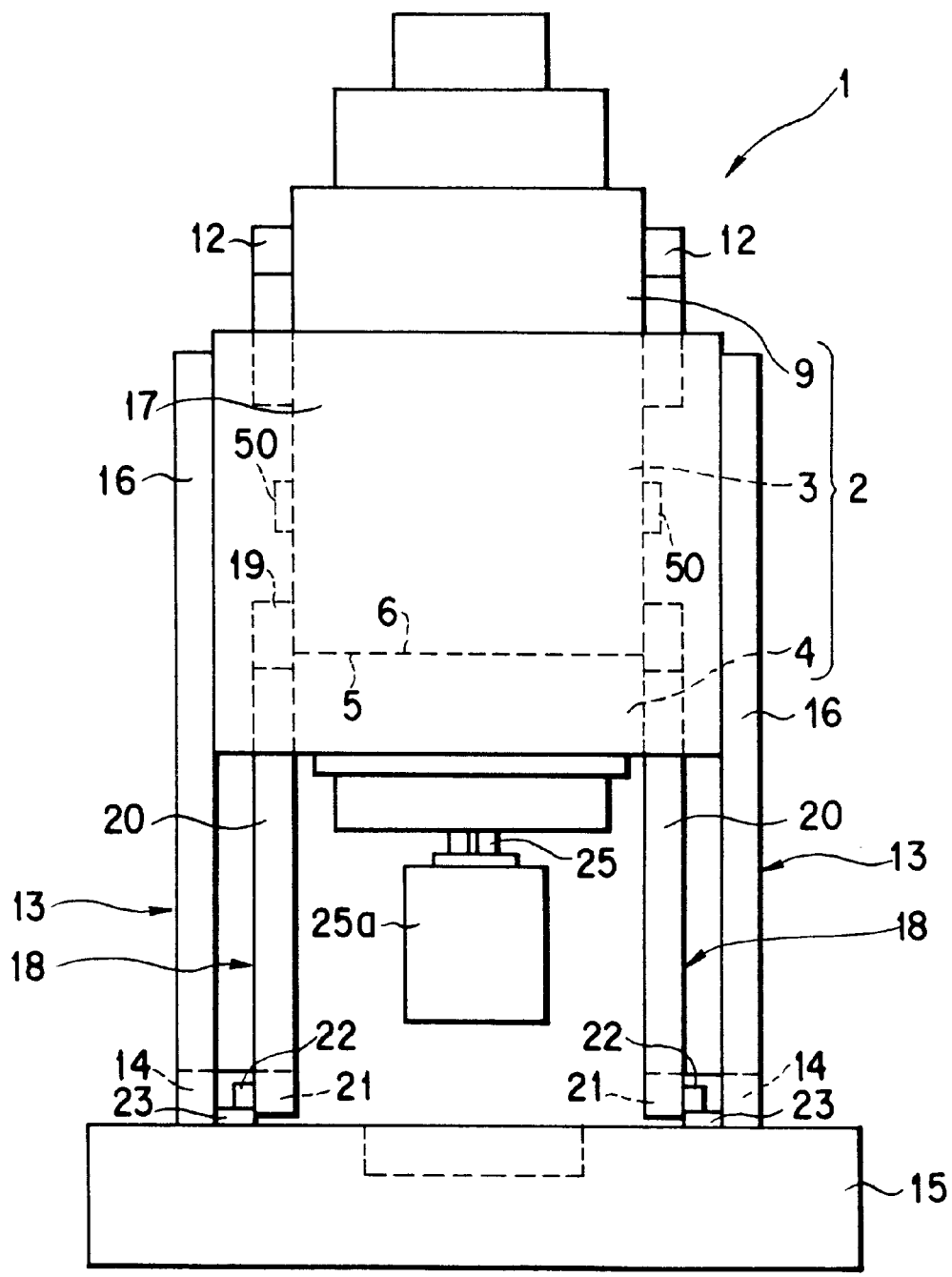
FIG. 1 is a front view of a CVD apparatus according to an embodiment of a process chamber apparatus of the present invention, which is in use, and according to an embodiment of a process apparatus using the process chamber apparatus.

The present invention will now be described with reference to the accompanying drawings. FIGS. 1 to 6 illustrate a process chamber apparatus according to an embodiment of the present invention and a CVD apparatus which is one of process apparatuses using the process chamber apparatus.

As illustrated in FIGS. 1 to 5, a CVD apparatus 1 includes a process chamber 2 having a substantially square horizontal cross-section which extends in a vertical direction. The process chamber 2 has a front surface located in the left side, a back surface located in the right side, and two side surfaces parallel to the plane of the figure in FIG. 2. The process chamber 2 includes an upper process chamber section 3 having an opening at each of its upper and lower ends, a lower process chamber section 4 having a closed lower end and an opened upper end, and an upper electrode 9 capable of air-tightly closing the opening of the upper end of the upper chamber section 3. The upper and lower process chamber sections 3 and 4 can be separated from each other, such that the boundary therebetween defines a cross-section which is vertical to the paper surface of FIG. 2 and crosses obliquely the outer circumferential surface of the process chamber 2. In other words, the cross-section as the boundary between the upper and lower process chamber sections 3 and 4 is inclined upward from the front surface to the back surface of the chamber 2, with respect to a horizontal surface which includes the movement direction. An angle θ of the inclination is favorably set to about 30°. However, the present invention is not limited to this angle, but it is desirable that the angle be set to a range of 15° to 45°. When the upper and lower process chamber sections 3 and 4 are combined with each other, a contact edge surface (an annular contact surface) 5 as the inclined cross-section of the upper process chamber section 3 and a contact edge surface (an annular contact surface) 6 as the inclined cross-section of the lower process chamber section 4 are tightly abutted with each other and sealed by means of an O-shaped ring 7 (shown in FIG. 6) provided in a circular groove formed in the contact edge surface 6. The contact edge surfaces 5 and 6 are oriented to the back and front of the CVD apparatus 1, respectively.

In the embodiment of the present invention, as will be described later, the lower process chamber section 4 is rearwardly moved against the upper process chamber section 3 so as to be separated from each other. Although the contact surfaces 5 and 6 are inclined upward from the front to the rear as described above, the contact surfaces may be inclined upward from one side to the opposite side and the lower process chamber section 4 may be moved to the other side.

An exhaust hole (not shown) is formed in the rear wall of the lower process chamber section 4, and a turbo-pump 8 is mounted on the outer surface of the rear wall. When an object is processed, the turbo-pump 8 is driven to exhaust air and/or gas from the chamber.

Reference numeral 9 indicates an upper electrode with which the opening of the upper end of the upper chamber section 3 is sealed at the time of processing. The upper electrode 9 can be vertically moved a little by an upper electrode hoisting and lowering mechanism 10 fixed on the side of the lower process chamber section 4. The upper electrode 9 is swung by an upper electrode swinging mechanism 11 fixed to the mechanism 10 through an arm 12 one end of which is fixed to the upper electrode 9 and the other end of which is pivotally supported by the mechanism 11, to selectively open and close the upper process chamber section 3. Thus, the electrode 9 also serves as a lid for the upper opening of the housing. It is essential only that the upper electrode hoisting and lowering mechanism 10 moves the electrode vertically. For example, a ball screw mechanism in which a nut is moved up and down by rotation of a screw, can be used. The upper electrode swinging mechanism 11 need not be limited to any specific one if it can swing the arm 12. For example, a rack and pinion mechanism can be used. Electric motors serving as a driving source of the mechanisms 10 and 11 are held in a box of the mechanism 11.

The upper electrode 9 is provided with means mechanism for supplying process gas into the process chamber 2 and a wiring connected to a high-frequency source, though they are not shown in FIGS. 1 to 5.

Reference numeral 13 denotes a pair of L-shaped first support frames arranged to separate with each other in a horizontal direction at a predetermined interval. Horizontal leg portions 14 of these frames 13 extend backward in parallel to each other on the upper flat surface of a base 15 and fixed to the base 15 by a means such as screws. Vertical supporting portions 16 of the support frames 13 rise from the front end portions of the horizontal leg portions 14, and their upper portions are fixed on the sides of mounting plates 17 attached to the front wall of the upper process chamber section 3, respectively to prevent the chamber section 3 from moving against the base 15.

Reference numeral 18 indicates a pair of U-shaped second support frames. The second support frames 18 have fixed portions 19 fixed on both side walls of the lower process chamber section 4, vertical portions 20 extending vertically downward from the front end portions of the fixed portions 19, and horizontal portions 21 extending horizontally from the lower ends of the vertical portions 20, and thus support the lower process chamber section 4. The horizontal portions 21 are arranged inside the horizontal leg portions 14 of the first support frames 13 at a small interval and extend in parallel to each other. A plurality of rollers 22 (front and rear two pairs of rollers in this embodiment) are rotatably supported on the side of the horizontal portion 21. These rollers can be rotated on a rail 23 formed on the base 15 and between the horizontal portion 21 and horizontal leg portion 14 in parallel thereto. If, therefore, the rollers 22 rotate, the lower process chamber section 4 moves to and from with respect to the upper process chamber section 3 and base 15.

In the above-described embodiment, the second support frames 18 and rails 23 constitute a moving mechanism and/or a moving guiding mechanism for relatively attaching/separating the upper and lower process chamber sections 3 and 4 to/from each other. However, the present invention is not limited to the moving mechanism having such a constitution. For example, the moving mechanism can be replaced with a so-called linear guide which allows horizontal portions 21 and horizontal leg portions 14 to move relatively to each other by means of a number of balls arranged between the opposing faces of the portions 21 and 14. The moving mechanism can also be so constituted that the horizontal portions 21 simply slide on the upper surface of the base 15. The power required for moving the lower process chamber section 4 by the above moving mechanism can be generated by human strength or mechanical means such as a motor.

In the embodiment of the present invention, the lower process chamber section 4 moves between a process position in which the section 4 contacts the upper process chamber section 3 to define a sealed chamber 2 (FIG. 2) and a maintenance position in which the section 4 completely separates backward at a predetermined distance from the section 3 (FIG. 4). The present invention is not limited to the inclination direction of the contact surface of the sections 3 and 4 or the moving direction of the section 4 of the above embodiment. For example, when the contact surface is inclined as shown in FIG. 4, the lower process chamber section 4 can be moved in any horizontal direction other than a direction perpendicular to the plane of FIG. 4. Needless to say, when the contact surface is not inclined, the section 4 can be moved in any direction as long as the direction is a lateral direction of the process chamber and allows both of the chamber sections to be separated from each other.

Figure 5:
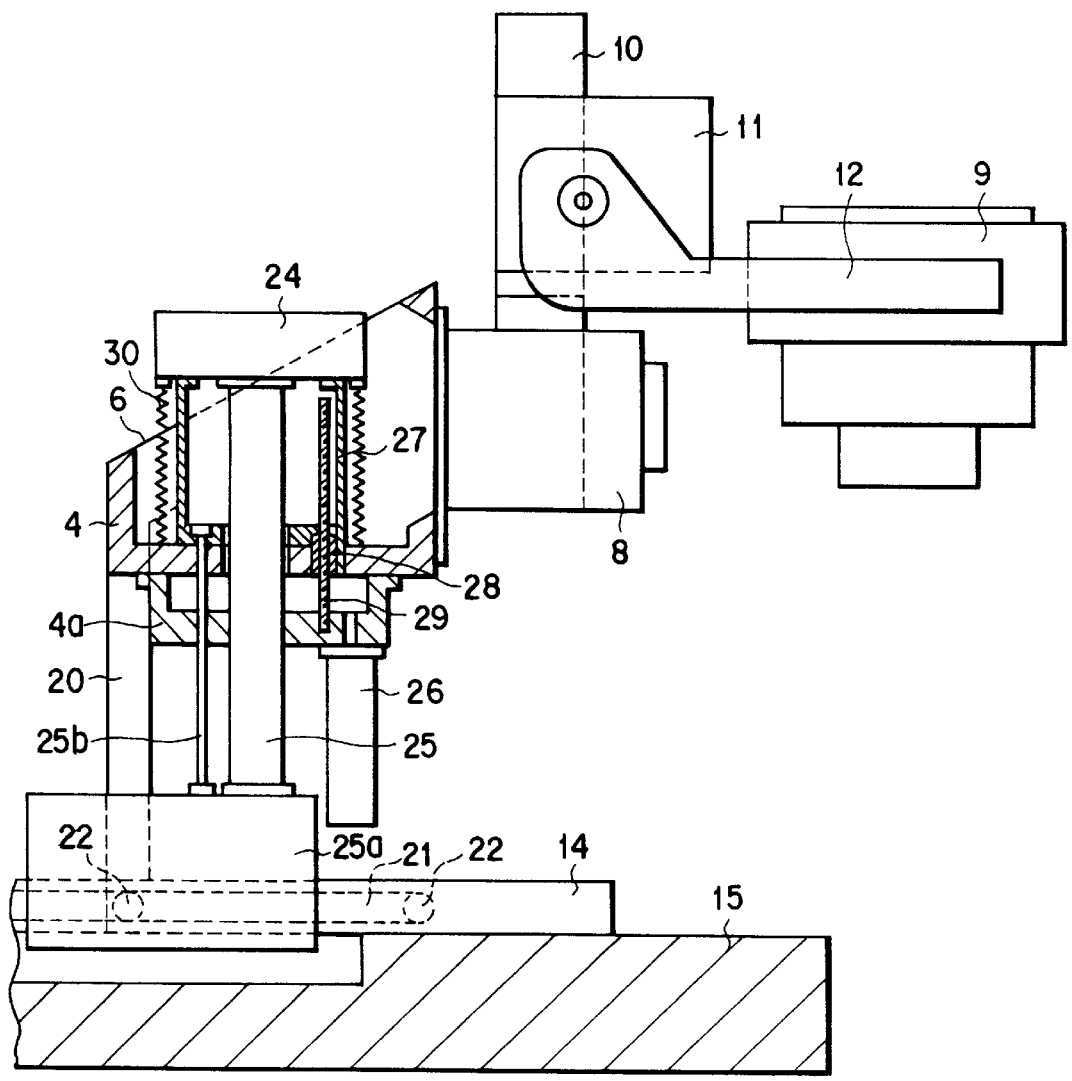
FIG. 5 is a longitudinal sectional view of the lower process chamber section shown in FIG. 4.
Figure 6:
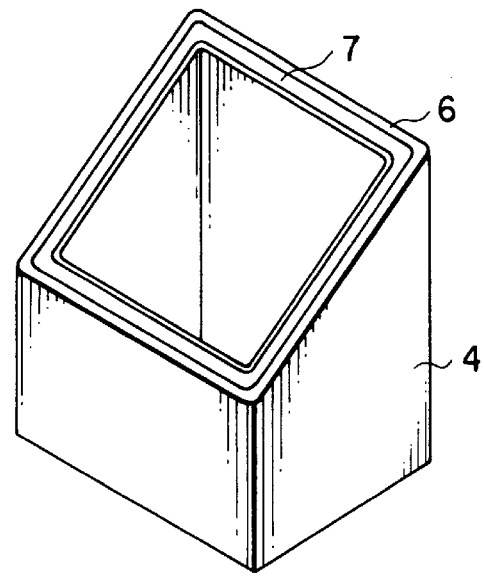
FIG. 6 is a perspective view of the lower process chamber section of the process chamber apparatus of the present invention.

In FIGS. 3 and 5, reference numeral 24 indicates a lower electrode on which an object to be processed is placed. A feeding rod 25 is connected to the center of the undersurface of the lower electrode so as to extend downward. The lower end of the feeding rod 25 is connected to an electric box 25a so that a high-frequency power source (not shown) arranged in the box 25a is electrically connected to the lower electrode 24 through a lead provided in the electrode rod 25. The electric box 25a can include other electric components and wiring, such as a control circuit and a power supply for driving motors of the hoisting and lowering mechanism and rotating mechanism. As can be understood well from FIG. 3, the electrode rod 25 extends through circular openings coaxially formed in the bottom of a box-shaped section 27, that of the lower process chamber section 4, and the mounting portion mounted on the undersurface of the chamber section 4. The side wall of the box-shaped section 27 rises vertically from the bottom thereof outside the electrode rod 25, and the upper end thereof is settled on the lower surface of the lower electrode 22 such that the side wall is vertically movable integrally together with the electrode 22. A pair of female screw holes 28 is formed so as to penetrate the bottom of the box-shaped section 27, and the holes 28 are arranged at predetermined intervals. For example, when the box-shaped section has a rectangular horizontal section, the screw holes are arranged on the diagonal at regular intervals from the center. An electric motor 26 is fixed to the lower end of the fixing member 4a. The rotation shaft of the motor is rotatably inserted in the fixing portion, and is connected so as to transmit rotation torque to the lower ends of a pair of female screw rods 29. Each female screw rod 29 freely penetrates a through-hole formed in the lower wall of the lower process chamber section 4 and extends upward vertically. The upper portions of the rods are inserted in and screwed in the female screw holes 28. As a result, as the female screw rods 29 are rotated by the motor, the box-like portion 27 thus and the lower electrode 22 are moved vertically in the process chamber 2 with respect to the chamber. Reference 25b indicates two guide shafts each having an upper end fixed to the lower wall of the box-like portion 27 and a lower end fixed to an electric box 25a. These shafts freely penetrate through-holes formed in the lower wall of the lower process chamber section 4 and the fixing portion 4a.

In order to prevent leakage of a gas through an opening formed in the lower wall of the lower chamber section 4 to allow the electrode rod 25 penetrate, a bellows 30 having upper and lower ends respectively attached to the lower electrode 22 and the lower wall of the lower process chamber section 4 is provided so as to surround the box-like portion 27 and the electrode rod 25.

Figure 7A:
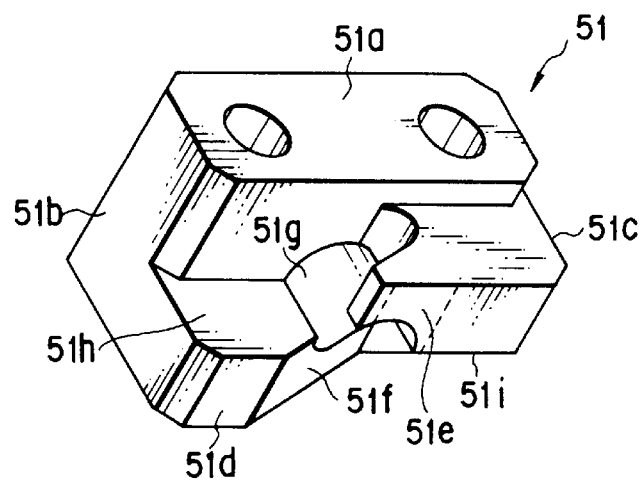
FIGS. 7A and 7B are perspective views illustrating their respective paired positioning members which constitute a positioning device for positioning the chamber sections.
Figure 7B:
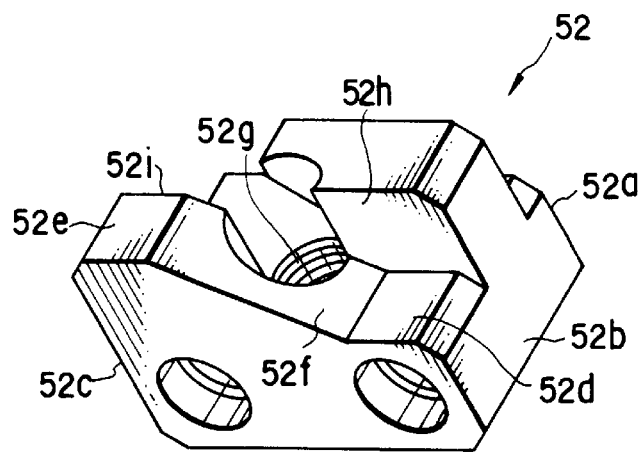
Figure 7C:
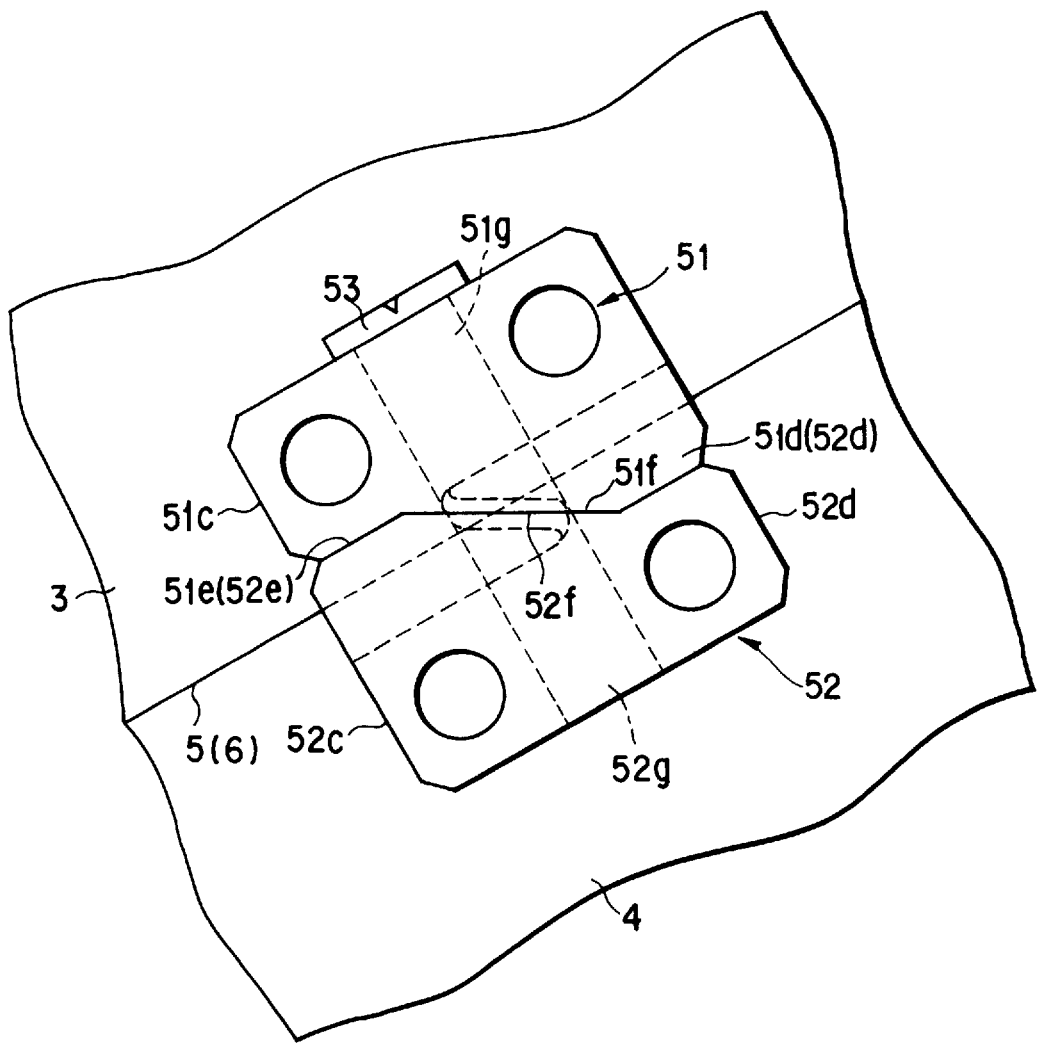
FIG. 7C is a plan view of the positioning members which are locked by a bolt.

A pair of positioning/locking mechanisms 50 shown in FIGS. 2, 7A, 7B, and 7C are attached to those portions of the outer surfaces of both side walls of the upper and lower process chambers 3 and 4 that correspond to each other. Each of the positioning mechanism comprises an upper positioning member 51 attached to the upper process chamber section 3 by a screw and a lower positioning member 52 attached to the lower process chamber section 4 by a screw. The upper positioning member 51 consists of a metal block having a side surface 51a to be in contact with the outer surface of the side wall of the upper chamber section, a rear surface 51b, and a front surface 51c, as shown in FIG. 7A. Two convex portions, one of which is large and the other of which is small, are formed on the lower surface of the block and situated apart from each other. As shown in FIG. 7C, the large convex portion defines first and second flat contact surfaces 51d and 51e inclined to be parallel with the contact surface of the chamber section 3, a third horizontal flat contact surface 51f which is positioned between the first and second contact surfaces, and a fourth vertical contact surface 51h. The other small convex portion defines a fifth vertical contact surface 51i. In the center of the block, a through-hole 51g is formed and penetrates the block to be perpendicular to the contact edge surfaces 5 and 6. Likewise, the lower positioning member 52 is made of a metal block having an upper surface which is shaped to complement the lower surface of the upper positioning member 51, as shown in FIG. 7B. This metal block has a side surface 52a, a rear surface 52b, a front surface 52c, first and second contact surfaces 52d and 52e which are inclined, a third horizontal contact surface 51f, fourth and fifth vertical contact surfaces 52h and 52i, and a screw hole 52g aligned with the through-hole 51g.

As shown in FIG. 7C, when the lower process chamber section 4 is moved in the arrow direction (forward) and is situated in a process position where the chamber sections 3 and 4 are fitted with each other, the pairs of first to third contact surfaces (51d and 52d, 51e and 52e, as well as 51f and 52f) are brought into contact with each other so that position restriction is effected so as to prevent the lower chamber section 4 from being shifted in the direction vertical against the upper chamber 3 and the advancing direction of the chamber section 4. That is, the first and second contact surfaces (51d, 52d and 51e, 52e) restrict the positions of the chamber sections in a vertical direction and an advancing direction of their own, and the third contact surfaces restrict the positions in the vertical direction. The pairs of fourth and fifth contact surfaces (51h and 52h as well as 51i and 52i) are brought into contact with each other thereby restricting the positions of the chamber sections in the lateral direction (e.g., the direction lateral to the moving direction of the lower process chamber section 4, i.e., the direction perpendicular to the paper surface of FIG. 2). A bolt 53 is screwed into the through-hole 51g and the screw hole 52g aligned with the hole 51g thereby fixing the positioning members 51 and 52 with each other, so that both the chamber sections are locked.

By the positioning/locking mechanism constructed as described above, both the chamber sections are integrally fitted with each other and leakage is not caused at the interface therebetween although a more or less margin is given to the lower chamber section, with respect to the upper chamber section.

Next, explanation will now be made of a step of separating and moving the lower process chamber section 4 from the upper process chamber section 3 to a maintenance position.

In the process position shown in FIG. 3, the screw 29 is rotated by an electric motor 26 to downwardly move the lower electrode 24 into the lower chamber section 4. Alternately, in case where the lower electrode 24 is arranged so as not to interfere the upper process chamber section 3 when separating instead the lower process chamber from the upper process chamber 3, e.g., in case where processing is carried out in the lower chamber section, the lower electrode 24 need not be moved previously. However, in a CVD apparatus, since processing is carried out with the generally, the lower electrode 24 has been elevated up to a desired height in the upper process chamber section. In this state, if the lower process chamber section 4 is horizontal moved to be separated from the upper process chamber section 3, the lower electrode 24 will be brought into contact with the inner surface of the rear wall of the upper process chamber section 3. To avoid interference between the lower electrode 24 and the upper process chamber section 3, the lower electrode 24 is moved down into the lower process chamber section 4, as shown in FIGS. 4 and 5.

Subsequently, the upper electrode 9 is elevated up to a position indicated by one-dot chain lines at an upper portion of the upper process chamber section 3, by the upper electrode elevating mechanism 10. Thereafter, the upper electrode 9 is swung to a position indicated by two-dot chain lines in the right side of the figure, by the upper electrode swinging mechanism 11, and finally, the upper electrode 9 is moved downward to a position indicated by broken lines, by the upper electrode elevation mechanism 10.

Next, the bolt 53 which locks the positioning members 51 and 52 is removed from the holes 51g and 52g.

In this state, a force in direction to the rear side which corresponds to the right side in FIGS. 2 and 3 is applied to the second support frames 18, so that the rollers 22 are rolled on the rails 23 thereby moving the second support frames 18 to the right side. As a result, the lower process chamber section 4 is separated from the upper process chamber section 3 without making the lower electrode 24 be interfered with the upper process chamber section 3, and stops, if necessary, by using a stopper, at the maintenance position indicated in FIGS. 4 and 5. At this position, the lower process chamber section 4 has been sufficiently shifted from the position just below the upper process chamber section 3, and an operator is not hindered at all from accessing with the lower process chamber section 4. Accordingly, at this maintenance position, maintenance of the inside of the process chamber, such as inspections and cleaning of the upper and lower electrodes 9 and 24 and the upper and lower process chamber sections 3 and 4 can be carried out sufficiently and securely with ease. After such maintenance, the CVD apparatus 1 can recover the state shown in FIGS. 2 and 3 by tracing the separation step as described above in a completely reverse order.

It is preferably impossible to move the lower chamber section 4 toward the maintenance position when the lower electrode 24 is positioned within the upper chamber section 3. Therefore, for example, a locking mechanism (not shown) which inhibits the movement of the second support frames 18 unless the motor 26 is driven and which is automatically released by driving of the motor may be provided between the frames 18 and the base 15.

From the state in which the lower process chamber section 4 is at the maintenance position, a force is applied in a direction to the left side in FIGS. 2 and 3 to make the second support frames 18 be moved to the left side so that the lower process chamber section 4 is made close to the upper process chamber section 3. Then, the contact edge surface 6 of the lower process chamber section 4 is fitted with the contact edge surface 5 of the upper process chamber section 3 by an O-ring 7, so that both of the process chamber sections are integrated with each other. In this contact, if the chamber sections 3 and 4 do not have enough position accuracy, positioning in the vertical and horizontal directions is carried out.

In the embodiment described above, as is apparent from the structure described above, the upper process chamber section 3 and the lower process chamber section 4 can be easily separated from each other, so that maintenance inside the process chamber 2 can be carried out efficiently.

The embodiment shown in FIGS. 1 to 7A, 7B, and 7C is applicable to an etching apparatus. In this case, names of the structure and respective components are same as those of a CVD apparatus, and specific explanation thereof will be omitted herefrom.

Also, in the explanation described above, the lower process chamber section can be abutted on and separated from the fixed upper process chamber section. Inversely, it is possible to make an arrangement such that an upper process chamber section can moved against a fixed lower process chamber section, or such that both the process chamber sections can be moved to be abutted on and separated from each other. For example, the horizontal portions 21 of the second support frames 18 are fixed onto the base 15, and rollers are supported on the horizontal leg portions 14 of the first support frames 13, such that the rollers are rolled on the rails. In this manner, the upper process chamber section can be moved from the fixed lower process chamber section. In addition, the rollers are supported on both the horizontal leg portions 14 of the first support frames 13 and the horizontal portions 21 of the second support frames 18, such that their rollers are rolled on the corresponding rails. In this manner, both of the process chamber sections are arranged to be movable to be fitted to and separated from each other. Preferably, an additional device such as another process chamber or chambers, or a lock arm chamber, which has a certain weight and is generally connected to the process chamber, is arranged so as to move the chamber section which is not connected with the additional device.

In the embodiment described above, the relative movement of the upper and lower process chamber sections in the lateral direction is effected in any direction on the horizontal plane. However, the movement need not always be horizontal but may be effected in a direction inclined to some extent from the horizontal direction. Specifically, it is preferable that the lower process chamber section is shifted at least in the lateral direction from the position just below the upper process chamber section maintenance inside the lower process chamber section can be carried out without interference from the upper process chamber section when both the process chamber sections are separated from each other. This position where the lower process chamber section is shifted laterally, i.e., the separation position where the section is laterally separated corresponds to the maintenance position in case of the above embodiment. However, both the positions need not correspond to each other. For example, after one of the chamber sections is moved laterally to a separation position, this chamber section may be moved upward or downward to the maintenance position.

The contact surfaces of both of the process chamber sections are preferably inclined from the horizontal plane when the upper process chamber section 3 and the lower process chamber section 4 are separated from each other. In this manner, maintenance inside both of the process chamber sections can be carried out from a horizontal direction with ease.

In the embodiment described above, the contact surfaces of the upper process chamber section 3 and the lower process chamber section 4 are inclined from the horizontal plane including the movement direction of the lower chamber section. Therefore, in the relative movement of the chamber sections to make a contact between both of the chamber sections or release the contact, the contact surfaces slide on and make contact with each other within a very small slide contact portion, and also slide for only a short sliding period, so that abrasion of the contact surfaces and/or O-ring is very small and a small force is required for moving the chamber sections.

Figure 8:
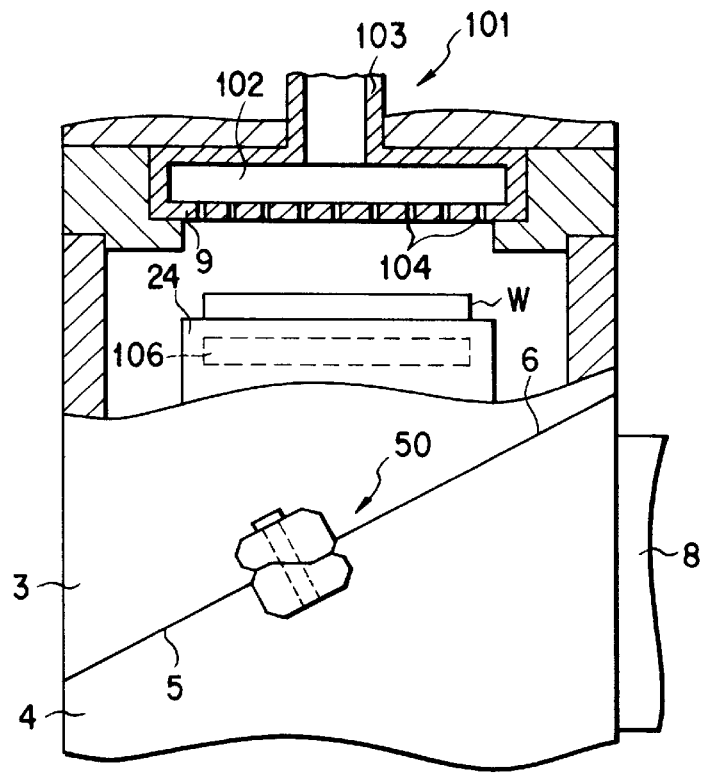
FIG. 8 is a partly longitudinal sectional view of the principal part of a CVD apparatus and that of an etching apparatus to which the present invention is applied.

With reference to FIG. 8, a CVD apparatus adopting the present invention (e.g., a plasma CVD apparatus in this case) will be explained below more specifically than in the case shown in FIGS. 1 to 5. For example, the CVD apparatus serves to perform film formation processing on a substrate such as a semiconductor wafer, a LCD substrate, or the like. The process chamber 2 used in this CVD apparatus 101 has the same structure as that in the case shown in FIGS. 1 to 7A, 7B, and 7C. The CVD apparatus 101 has an upper electrode which seals the upper end opening portion of the upper process chamber section 3. A gas chamber 102 is defined in the upper electrode 9, and a process gas is introduced into the gas chamber 102 through the upper process gas inlet port 103 by a gas source (not shown). A plurality of small gas holes 104 are formed in the lower wall of the upper electrode 9 to inject downward the process gas from inside the gas chamber 102.

A lower electrode 24 as has been explained with reference to FIG. 5 is provided just below the upper electrode 9 such that the lower electrode 24 can move up and down between the upper process chamber section 3 and the lower process chamber section 4. When using the CVD apparatus 101, the lower electrode 24 is moved upward and opposed to the upper electrode 9 just below the upper electrode 9, such that the distance between the upper electrode 9 and the lower electrode 24 is set to a desired value. In addition, a heating member 106 is embedded in the lower electrode 24 to heat a substrate W set on the upper surface thereof. When performing film formation processing on the substrate W, the inside of the process chamber 2 is maintained at a lower pressure by a turbo pump 8, and the substrate W set on the upper surface of the lower electrode 24 is heated by the heater 106. A material gas for forming a film is injected from the gas holes 104, and a plasma of the material gas is generated by applying a highfrequency voltage of, for example, 13.56 MHz between the upper electrode 9 and the lower electrode 24. Film formation processing is performed by plasma CVD. A process gas once used is exhausted from an exhaust port by the turbo pump 8. In this CVD apparatus 101, maintenance of the inside of the process chamber such as removal of films sticking on the upper electrode 9, the lower electrode 24, and inner walls of the upper process chamber section 3 and the lower process chamber section 4 is carried out by separating the upper process chamber section 3 and the lower process chamber section 4 apart from each other, as has been described before. The structure thus explained with reference to FIG. 8 can be used for an etching apparatus. In an etching apparatus, an etching gas is used as a process gas.

Figure 9:
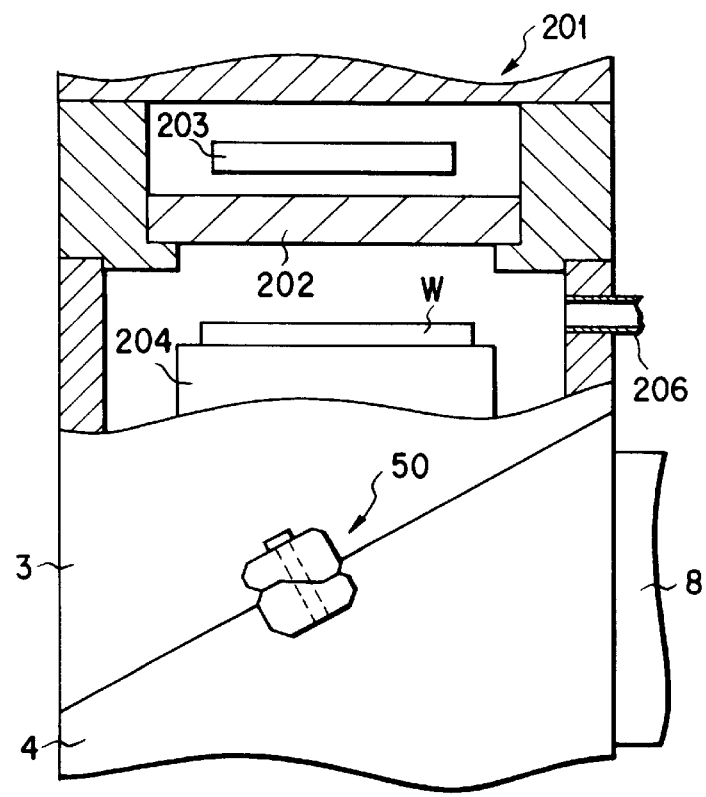
FIG. 9 is a partly sectional view of a sputtering apparatus to which the present invention is applied.

With reference to FIG. 9, explanation will be made of an embodiment in which the present invention is applied to a spattering apparatus. This sputtering apparatus 201 has a process chamber 2 including an upper process chamber section 3 and a lower process chamber section as described before, and a target 202 positioned at an upper portion in the upper process chamber section. A magnet 203 is provided above the target 202.

A susceptor 204 is provided just below the target 202 such that the susceptor 204 can move up and down between the upper process chamber section 3 and the lower process chamber section 4, like the lower electrode 24 in the case of FIG. 8. Further, when using the sputtering apparatus 201, the susceptor 204 is moved up as shown in FIG. 8 so as to oppose to the target 202 with a predetermined distance maintained therefrom below the target. When performing film formation processing on a wafer W as a target to be processed by the sputtering apparatus 201, the inside of the process chamber 2 is maintained at a predetermined low pressure by the turbo pump 8, and a voltage is applied between the process chamber 2 and the target 202 with the target 202 used as a cathode, and a magnetic field is formed near the target 202 by the magnet 203 to generate a plasma of a process gas such as an inactive gas of argon or the like, supplied by an inlet port 206. In this manner, grains are sputtered out of the target 202 thus performing film formation processing on the wafer W set on the susceptor 204. A process gas once used is exhausted through the exhaust port by the turbo pump 8. The other points of the structure than those described above are the same as in the case shown in FIGS. 1 to 7A, 7B, 7C, and explanation thereof will be omitted herefrom.

In this sputtering apparatus 201, maintenance inside the process chamber such as removal of films sticking on inner walls of the susceptor 204 and the upper and lower process chamber sections 3 and 4 is carried out by separating the upper process chamber section 3 and the lower process chamber section 4 apart from each other.

Although the above explanation has been made to cases where the present invention is applied to a CVD apparatus, an etching apparatus, and a sputtering apparatus, the present invention is applicable to other process apparatuses.

According to the present invention, it is advantageous in that maintenance inside the process chamber can be performed easily.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A process chamber apparatus comprising:
   a process chamber for processing a process target contained therein, including an upper process chamber section having an annular contact surface at a lower end of the upper process chamber section, and a lower process chamber section having an annular contact surface at an upper end; and
   a support mechanism for supporting the process chamber such that both of the upper and lower process chamber sections are relatively movable in a lateral direction between a process position where both of the upper and lower process chamber sections are combined with each other and a separation position where both of the process chamber sections are separated apart from each other in a lateral direction,
   the contact surfaces of the upper and lower process chamber sections being inclined with respect to a plane including a movement direction of the process chamber sections and being brought into contact with each other throughout entire circumferences of the annular contact surfaces at the process position.

2. An apparatus according to claim 1, wherein the support mechanism includes a base, at least one first support member for fixing one of the upper and lower process chamber sections to the base, and at least one second support member for supporting an other one of the upper and lower process chamber sections such that the other one of the upper and lower process chamber sections is movable in a lateral direction.

3. An apparatus according to claim 2, wherein the second support member supports the lower process chamber section such that the lower process chamber section is movable only in a horizontal direction.

4. A process chamber apparatus according to claim 1, wherein the contact surfaces are inclined at an angle of 10° to 45° with respect to the movement direction of the process chamber sections.

5. An apparatus according to claim 1, further comprising a susceptor provided in the process chamber, for supporting the target, and a drive mechanism for making a movement of the susceptor between a process position inside the upper process chamber section and a separation position inside the lower process chamber section.

6. An apparatus according to claim 1, wherein the upper process chamber has an opening at a top end, and which comprises an electrode attached to the upper process chamber such that the opening is opened or closed by the electrode.

7. An apparatus according to claim 1, wherein both of the upper and lower process chamber sections have a positioning mechanism for defining positions of the upper and lower process chamber sections in a vertical direction and a lateral direction.

8. An apparatus according to claim 7, wherein the positioning mechanism includes an upper positioning member attached to the upper process chamber section, a lower positioning member attached to the lower process chamber section, and means for locking the upper and lower process chamber sections by connecting the upper and lower positioning members with each other.

9. An apparatus according to claim 7, wherein the positioning mechanism includes an upper positioning member attached to the upper process chamber section and a lower positioning member attached to the lower process chamber section, and each of the upper and lower positioning members has at least one contact surface which defines positions of the both of the upper and lower chamber sections in a lateral direction and in a vertical direction when the contact surfaces of the upper and lower chamber sections are brought into contact with each other.

10. A process chamber apparatus comprising:

a process chamber for processing a process target, including an upper process chamber section having an annular contact surface at a lower end thereof, and a lower process chamber section having an annular contact surface at an upper end;

a susceptor for supporting the process target in the process chamber;

a support mechanism for supporting the process chamber such that one of the upper and lower process chamber sections is movable with respect to the other of the upper and lower process chamber sections in a lateral direction, between a process position where both of the upper and lower process chamber sections are integrated with each other and a separation position where both of the upper and lower process chamber sections are separated apart from each other; and a drive mechanism for moving the susceptor from inside of the upper process chamber section to inside of the lower process chamber section when the one of the upper and lower process chamber sections is moved from the process position to the separation position.

11. A process chamber apparatus comprising:

a process chamber for processing a process target contained therein, including an upper process chamber section having an annular contact surface at a lower end of the upper process chamber section, and a lower process chamber section having an annular contact surface at an upper end; and a support mechanism for supporting the process chamber such that both of the upper and lower process chamber sections are relatively movable in a lateral direction between a process position where both of the upper and lower process chamber sections are combined with each other and a separation position where both of the process chamber sections are separated apart from each other in a lateral direction.

12. An apparatus according to claim 11, wherein the support mechanism supports the process chamber such that the lower process chamber section is movable against the upper process chamber section in a horizontal direction.

\* \* \* \* \*